Figure 1:
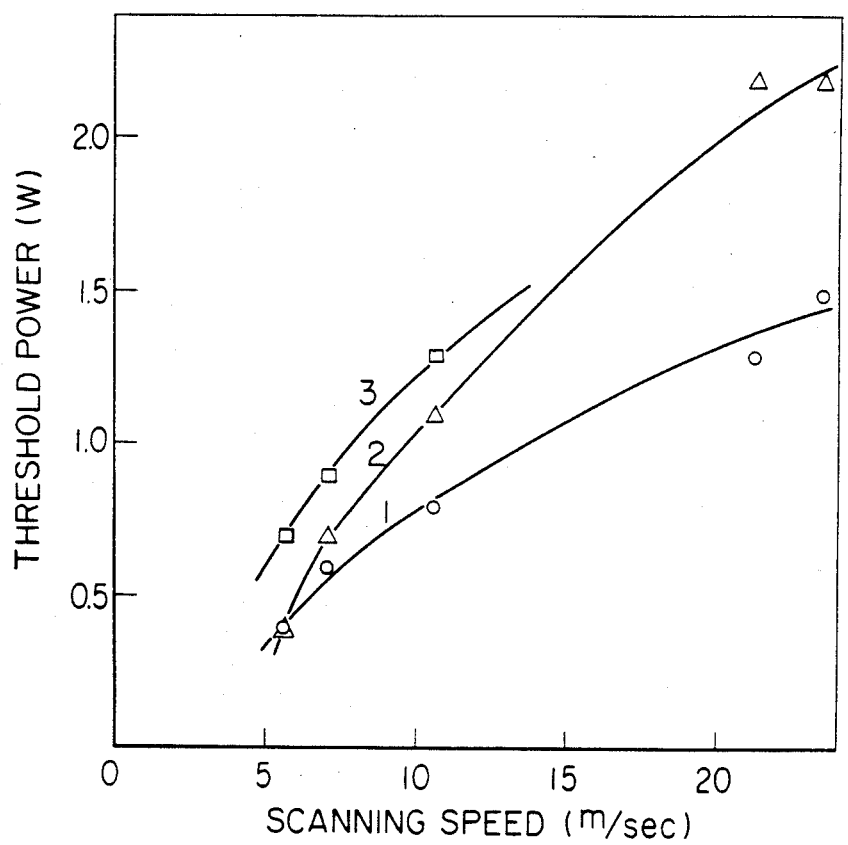

United States Patent [19]

Kojima et al.

[11] Patent Number: 4,547,456
[45] Date of Patent: Oct. 15, 1985

[54] HEAT MODE RECORDING MATERIAL AND A RECORDING METHOD BY THE USE THEREOF

[75] Inventors: Yasuo Kojima, Hachioji; Fumio Shimada, Fusa, both of Japan

[73] Assignee: Konishiroku Photo Industry Co., Ltd., Japan

[21] Appl. No.: 537,063

[22] Filed: Sep. 29, 1983

Related U.S. Application Data

[63] Continuation of Ser. No. 255,180, Apr. 17, 1981, abandoned.

[30] Foreign Application Priority Data

Apr. 22, 1980 [JP] Japan .................................. 55-53739
Sep. 29, 1980 [JP] Japan ................................. 55-134463

[51] Int. Cl.$^4$ .............................................. G03C 1/71
[52] U.S. Cl. ................... 430/330; 346/135.1; 427/53.1; 428/195; 428/500; 428/523; 428/913; 430/945
[58] Field of Search ............... 428/195, 913, 500, 523; 346/135.1; 430/330, 945; 427/43.1, 53.1, 56.1

[56] References Cited

U.S. PATENT DOCUMENTS

| | | | |
|---|---|---|---|
| 3,264,272 | 8/1966 | Rees | 260/78.5 |
| 3,437,718 | 4/1969 | Rees | 260/889 |
| 3,454,676 | 7/1969 | Busse | 260/897 |
| 3,674,896 | 7/1972 | Purcell et al. | 260/897 B |
| 3,736,311 | 5/1973 | Subramanian | 260/91.3 PV |
| 3,993,616 | 11/1976 | Gross | 260/29.4 UA |
| 4,109,088 | 9/1979 | Hansen | 260/29.6 WB |

Primary Examiner—Bruce H. Hess
Attorney, Agent, or Firm—Finnegan, Henderson, Farabow, Garrett & Dunner

[57] ABSTRACT

A heat mode recording material comprising a support and a heat sensitive layer positioned on the support, the heat sensitive layer comprising: (a) an ionomer resin obtained by ionically cross-linking with at least one metal ion, a copolymer comprising an alpha-olefin and an alpha-methylene aliphatic monocarboxylic acid; and (b) a hydrophilic binder. A method for recording image information using the above material is also disclosed and claimed.

20 Claims, 1 Drawing Figure

HEAT MODE RECORDING MATERIAL AND A RECORDING METHOD BY THE USE THEREOF

This is a continuation of application Ser. No. 255,180, filed Apr. 17, 1981, now abandoned.

The present invention relates to a heat mode recording material having a heat sensitive layer, and a method for recording image information by the use of a recording material provided with a heat sensitive layer.

Unlike the silver halide photographic material, the heat mode recording material need not be processed under safelight or in dark room. Further, it can reproduce a visible image directly, for example, under application of a heat pattern. Therefore, the heat mode recording material provides a quicker and simpler image forming process than the silver halide photosensitive material. Since the heat mode recording material is applicable to a wide range of practical application, a number of proposals have thus been made for the heat mode recording material and method. To apply high energy density light in recording to such heat mode recording material, for example, a method to convert an information to be recorded into an electric time sequential signal so a laser beam may be modulated with such signal and used to scan the recording material. Thus, it needs very short time to record by irradiation. Such recording system has advantages in its quick information processing and also from an economical standpoint.

The heat mode recording material heretofore known that forms a visible image directly under application of a heat pattern makes use of a phenomenon of coloring, color changing or discoloration that is primarily caused by a chemical reaction and initiated or facilitated by heating. Therefore, even after formation of an image, the heat sensitive substance in unexposed areas undergoes the reaction when heated, so this type of recording material has a disadvantage in that it is difficult to fix the image.

Accordingly, a modified type of heat mode recording material and method that are so designed that when the heat sensitive layer of recording material is exposed to a heat pattern a heat sensitive substance contained therein undergoes some changes in its physical properties to form a latent image from which a visible image is to be developed by, for example, removal of an unexposed portion, by selectively applying a coloring agent or by selectively transferring the image or non-image portion to a image-receiving medium have been proposed since by making use of such heat mode recording material and method it has become possible to improve such disadvantages which had accompanied with the conventional heat mode recording material and they can be used as a more convenient means in handling than conventional photosensitive materials used for copy reproduction, printing, recording, etc.

For example, Japanese Patent Publication No. 1743/1964 discloses a heat mode recording material comprising a layer composed of a polymer molecules capable of filming at or above 40° C. However, this type of heat mode recording material making use of such apparent coating film has a defect that the film formed is not rigid, being very weak and liable to peel off.

Further, Japanese Patent Publication No. 22957/1969 discloses a heat mode recording method that exposes a heat sensitive layer, which comprises a particle of hydrophobic thermoplastic polymer dispersed in a mass of hydrophilic binder together with a substance which is capable of transforming light to heat, the particle of hydrophobic thermoplastic polymer being used at a ratio of 1:1 or more to said binder. In the above publication, polyethylene is cited for a preferable compound for the particle of hydrophobic thermoplastic polymer. However, if polyethylene is used for the heat sensitive ingredient, the coating film becomes weak in mechanical strength, so if the heat sensitive layer is rubbed, even exposed areas are sometimes removed. Further, there is a difficulty that much radiation energy is required for exposure.

For the heat mode recording material as mentioned above, for example, one whose recording layer is composed of three sublayers made of germanium, bismuth and selenium, is already known, as disclosed by Japanese Patent Publication No. 40479/1971. Further, a heat mode recording material that is provided with a layer for a reduction of heat conduction between the recording layer and its base is disclosed by Japanese Patent Publication Open to Public Inspection (hereinafter referred to as Japanese Patent O.P.I. Publication) No. 126237/1975. In addition, a heat sensitive recording material that is provided with both a protective layer and heat insulating layer is also described by Japanese Patent Publication No. 14263/1976.

However, all the arts as described by these Patent Publications require some vacuum pumped systems for evaporation or sputtering, which makes not only the product recording material very expensive but its preparation process complicated. Further, selenium, tellurium, bismuth, indium, tin, their sulfide, fluoride and oxide, etc. are compounds unfavorable for the health of human body, so their use has demerits such as a much danger of environmental pollution.

Meanwhile, Japanese Patent Publication No. 35144/1976 describes an image recording method that provides a transparent support with a recording layer, which is composed of a self-oxidaine binder with a substance which absorbs radiation such as carbon black dispersed therein, and passes a laser beam through the support for exposure of the recording layer, the exposed layer being blown for image formation. However, the above art has defects that the recording layer formed is very weak in mechanical strength being liable to scratches or damages and performs poorly in resolution and that the recording method used dissipates much energy for recording.

Beside, Japanese Patent Publication Open to Public Inspection (hereinafter referred to as Japanese Patent O.P.I. Publication) No. 82431/1977 discloses a heat mode recording material that comprises albumin for the heat sensitive ingredient. However, if albumin is used for the heat sensitive ingredient, the coating film becomes weak in mechanical strength requiring much care in its handling during and even after development. Therefore, the above method is far from any practical application. It has also a defect that it does not give sharp images since the heat sensitive layer swells at the time of development.

As mentioned above, though provided with many remarkable features, these recording materials of prior art have defects that they are not sensitive enough and their coating film is not strong enough.

Accordingly, it is an object of the present invention to provide a heat mode recording material of high sensitivity.

It is another object of the present invention to provide a heat mode recording material that exhibits superior resistance to oil and chemicals and is capable of reproducing images of high mechanical strength.

It is another object of the present invention to provide a heat mode recording material that requires neither organic solvent nor aqueous alkaline solution for its development.

It is still another object of the present invention to provide a heat mode recording material having a heat sensitive layer that provides sharp after-exposure image visibility (or image visibility after exposure or recording and before development).

The above and other objects of the present invention can be achieved by using a heat mode recording material having a heat sensitive layer comprising an ionomer resin.

According to a preferred embodiment of the present invention, the ionomer resin as mentioned above is a copolymer comprising α-olefin (and preferably ethylene) and α-methylene aliphatic monocarboxylic acid (and preferably acrylic acid or methacrylic acid) and cross-linked by an ionic bond with use of a metal ion or ions (and preferably $Na^+$, $Mg^{++}$ and/or $Zn^{++}$) while the heat sensitive layer of the present invention contains a water soluble polymeric compound (preferably polyvinyl alcohol and particularly one which comprises 85 to 90 mol % of vinyl alcohol unit) as a binder, the weight ratio of the ionomer resin to the water soluble polymeric compound being 2:3 to 9:1.

Accordingly, it is an object of the present invention to provide a recording method capable of recording at low energy.

Another object of the present invention is to provide a recording method to which a recording material provided with a coating film of high mechanical strength is applicable.

Another object of the present invention is to provide a recording method to which a recording material that is cheap and accompanied with little danger of causing the environmental pollution is applicable.

The above and other objects of the present invention may be achieved by a recording method that makes use of a heat mode recording material insolubilizable under irradiation and applies high energy density light to such recording material for insolubilization of exposed areas, being characterized by indirect exposure through the support.

According to a preferred embodiment of the present invention, a heat mode recording material is provided with a heat sensitive layer comprising a substance which is capable of transforming light to heat and with an ionomer resin dispersed in a hydrophilic binder used more than at a ratio of 1:1 to said binder.

According to another preferred embodiment of the present invention, a laser beam is used for high energy density light used for recording while for the treatment liquid used to remove unexposed areas after exposure (namely, recording) a solvent for the binder of heat sensitive layer, and particularly an aqueous liquid is used, neither an organic solvent nor alkaline solution being required.

In the present invention, any kind of ionomer resins may be used though it is preferable to use a copolymer comprising α-olefin and α-methylene aliphatic monocarboxylic acid and cross-linked by an ionic bond with use of one or several of metal ion. α-olefin used for the copolymer for the above ionomer resin is preferably represented by a general formula of $RCH=CH_2$, where R is a hydrogen atom or an alkyl group preferably containing 1 to 8 carbon atoms. Namely, preferable olefins include ethylene, propylene, butene-1, pentene-1, hexene-1, heptene-1, 3-methylbutene-1, 4-methylpentene-1.

α-Methylene aliphatic monocarboxylic acid used for the above copolymer is preferably one that has 3 to 8 carbon atoms in its molecule. Namely, preferable α-methylene apliphatic monocarboxylic acids include acrylic acid, methacrylic acid, ethacrylic acid, itaconic acid, maleic acid, fumaric acid, and their esters, such as methyl acrylate, ethyl acrylate, methyl methacrylate, n-butyl methacrylate, dimethyl fumarate, diethyl itaconate, and dimethyl maleate.

Both these α-olefins and α-methylene aliphatic monocarboxylic acids may be used independently or in combination.

An ionemer resin is prepared from the above copolymer using a proper metal ion selected from monovalent, divalent or trivalent metal ions. Examples of suitable monovalent metal ion are $Na^+$, $K^+$, $Li^+$, $Cs^+$, $Ag^+$ and $Hg^+$. Examples of suitable divalent metal ion are $Be^{++}$, $Mg^{++}$, $Ca^{++}$, $Sr^{++}$, $Ba^{++}$, $Cu^{++}$, $Cd^{++}$, $Hg^{++}$, $Sn^{++}$, $Pb^{++}$, $Fe^{++}$, $Co^{++}$, $Ni^{++}$, and $Zn^{++}$. And examples of suitable trivalent metal ion are $Al^{+++}$, $Sc^{+++}$, $Fe^{+++}$, and $Y^{+++}$. Among these ions, $Na^+$, $Mg^{++}$, and $Zn^{++}$ ions are preferable in the present invention.

Among ionomer resins thus prepared, those that are made available by ionically cross-linking ethylene/acrylic acid copolymer and ethylene/methacrylic acid copolymer with use of $Na^+$, $Mg^{++}$, or $Zn^{++}$ ion are preferable.

Ionomer resins used in the present invention can be prepared in conformity to methods as described in Japanese Patent Publication Nos. 6810/1964 and 15768/1967, and Japanese Patent O.P.I. Publication Nos. 31556/1974 and 121891/1974.

The heat mode recording material related to the present invention may comprise some quantity of a binder, and particularly a hydrophilic one. Preferable examples of hydrophilic binder are gelatin, glue, casein, zein, hydroxyethyl cellulose, carboxymethyl cellulose, methyl cellulose, carboxymethyl hydroxyethyl cellulose, hydroxyethyl starch, gum arabic, sucrose octacetate, ammonium alginate, sodium alginate, polyvinyl alcohol, polyvinylpyrrolidone, polyvinylamine, polyethylene oxide, polystyrylsulfonic acid, and polyacrylic acid. In the present invention, polyvinyl alcohol is preferable, and one which comprises 85 to 90 mol % of vinyl alcohol unit is more preferable.

However, the heat mode recording material related to the present invention need not always comprise a binder. Thus, the hydrophilic binder may be added in a content of range from 0 to 80% though a preferable content ranges from 10% to 60% because with less than 10% of the hydrophilic binder unexposed areas are not soluble enough while with more than 60% of such binder exposed areas sometimes harden to an unsatisfactory mechanical strength.

An ionomer resin suitable for the heat mode recording material related to the present invention can be applied in a form of aqueous suspension with or without a hydrophilic binder. Such aqueous suspension may be obtained by dispersing an ionomer resin into water heated under pressure. For the above dispersing method, a detailed description is given in Japanese Patent O.P.I. Publication No. 62890/1976, etc. Another method is to disperse an ionomer resin in a form of fine powder into water with use of a surfactant or hydrophilic protective colloid, for example, polyvinyl alcohol. The grain size of the ionomer resin in the suspension may be in a range from 0.01 to 50μ though the preferable range is from 0.05 to 2μ, for a grain size above 2μ or below 0.05μ often lowers the resolution or sensitivity, respectively.

The ionomer resin and water soluble polymeric compound (preferably polyvinyl alcohol) as a binder used in the present invention are preferably mixed in a weight ratio of 2:3 to 9:1, though there is no limitation to such weight ratio. If the ionomer resin is used too little to satisfy the above range, exposed areas often harden to unsatisfactory mechanical strength while if the quantity is too much unexposed parts often fail to exhibit enough solubility.

The ionomer resin used in the present invention is applied in a form of aqueous suspension. The ionomer resin content of such aqueous suspension is preferably 1% to 100% of the water used, for if the content is lower than 1% the coating film cannot attain enough thickness while if it is higher than 100% the suspension often becomes too viscous to be used conveniently.

The heat sensitive layer of the present invention preferably comprises a pigment or dye so as to make effective use of the energy of radiation, such as visible ray, infrared ray, etc. Particularly in the method of present invention high energy density light from YAG laser, Ar laser, He-Ne laser, or the like can preferably be used.

Any pigment or dye may be used for this purpose as far as it is capable of converting an arbitrary pattern of X-ray, ultraviolet ray, visible ray, infrared ray, etc. into a heat pattern. Particularly, pigments and dyes that exhibit absorptions in the visible and near-infrared spectral ranges, such as graphite, carbon black, phthalocyanine dyes, iron powder, iron oxide powder, lead oxide, and black silver, are preferable, among which carbon black and graphite are more preferable.

For the heat sensitive layer of the present invention, the ionomer resin as heat sensitive ingredient may be used in combination with a hydrophilic binder and pigment (preferably carbon black or the like) or dye added as necessary, when a preferable mixing ratio of the ionomer resin plus the binder to the pigment or dye is between 1:1 to 20:1. The dye or pigment used in the present invention may also be added by dissolving or dispersing it into the mass of ionomer resin beforehand.

Examples of the support used for the heat mode recording material in the present invention are either transparent or untransparent for light such as paper, paper laminated with a plastic (for example, polyethylene, polypropylene, polystyrene, or the like), metal plates made of aluminium, zinc, copper, etc., plastic films made of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc., among which the polyethylene terephthalate film and aluminium plate are more preferable. Particularly, the aluminium plate is preferably surface treated by grained, dipping in an aqueous solution of sodium silicate, potassium fluorozirconate, phosphate or the like, anodic oxidation, or other method.

According to preferred embodiment of the present invention the support used for the recording method is transparent or slightly opaque. Examples of the support are plastic films made of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc. as well as glass plate, among which the polyethylene terephthalate film is more preferable.

In the present invention, an intermediate layer composed of gelatin, casein, polyvinyl alcohol, ethyl cellulose, phenol resin, diazo resin, styrene/maleic anhydride copolymer, polyacrylic acid, or the like may be provided, as necessary, between the above support and heat sensitive layer to improve the adherence of the layer to the support and prevent the pinhole trouble.

Further, to prevent the surface of heat sensitive layer from being scratched or improve the adhering performance under vacuum, the heat mode recording material used in the present invention may be provided with an overcoat layer that dissolves or swells at the time of development. This overcoat layer may be a resin layer that is mechanically matted or comprising a matting agent. Examples of such matting agent are silicon dioxide, zinc oxide, titanium oxide, zirconium oxide, particle of glass, alumina, starch, particle of polymer (for example, particle of polymethyl methacrylate, polystyrene and phenol resin), and matting agents as disclosed by U.S. Pat. Nos. 2,701,245 and 2,992,101. They may also be used in combination. A proper resin may be selected for use in the overcoat layer comprising a matting agent. Examples of such proper resin are gum arabic, glue, gelatin, casein, cellulose products (for example, viscose, methyl cellulose, ethyl cellulose, hydroxyethyl cellulose, hydroxypropyl methyl cellulose, carboxymethyl cellulose, etc.), starch products (for example, soluble starch and modified starch), polyvinyl alcohol, polyethylene oxide, polyacrylic acid, polyacrylamide, polyvinyl methyl ether, polyvinylpyrrolidone, polyamides, etc. They may also be used in combination.

To prepare the heat mode recording material related to the present invention, for example, an aqueous suspension of an ionomer resin is mixed with a hydrophilic binder and pigment or dye and the mixture is ground by a ball mill or ultrasonic homogenizer for uniform dispersion. A support as mentioned above is coated with the resultant suspension to a film thickness of 1 to 50μ and preferably 1 to 15μ, and dried at 30° to 50° C. to give the final product.

The heat mode recording material related to the present invention can be treated with an aqueous liquid only, without use of any organic solvent or alkaline solution.

A first method washes away areas of the heat sensitive layer of recording material that remain permiable and soluble to reproduce an image.

A second method dips the recording material in an aqueous solution of dye so the dye may diffuse into the areas of its heat sensitive layer that remain hydrophilic for reproduction of an image.

A third method transfers areas of the heat sensitive layer that remain hydrophilic to a copy medium at a wet or dry state for reproduction of an image.

A fourth method uses the recording material on which an imagewise hydrophilic/hydrophobic pattern is formed in lithography to make multiple copies.

The heat mode recording material related to the present invention can be subjected to contact exposure using a xenon lamp, halogen lamp, tungsten lamp or the like as the light source. A flash light preferably having a duration of 10 msec or less and characterized by high radiation intensity in the infrared spectral range is preferable.

The high energy density light used in the present invention is, for example, a laser beam, such as the Ar laser beam, He-Ne laser beam or semiconductor laser beam, or a beam from a halogen lamp or tungsten lamp, or a flash of light from a xenon lamp. The preferable beam intensity is approx. 100 W/cm$^2$ or more, for a weaker beam intensity makes it difficult to reproduce images or lowers the resolving power remarkably. Among these beams, laser beams and a flash of xenon lamp of a duration of 10 msec. or less are preferable for use in the present invention. According to the present invention, high energy density light as mentioned above is applied through the support of the heat mode recording material, namely, from behind the material for irradiation and exposure.

The laser beam that can be preferably used in the present invention may be the so-called "zero'th mode beam" or "first mode beam".

The recording method of the present invention has such industrial merits as (1) a lithographic master is made available from it without using any development process, (2) it can be used as a recording material across which a pattern of current is passed for heat generation and recording, (3) it can be scanned for exposure by a laser beam so a facsimile film or lithographic master may be made available, and (4) an inexpensive lithographic film of high resolution may be obtained.

To further illustrate the present invention, and not by way of limitation, the following examples are given. It is noted that a term "parts by weight" is hereinafter abbreviated as "parts".

EXAMPLE 1

Composition:

| | |
|---|---|
| Carbon black (mean grain size: 30 mµ) | 2 parts |
| Copolen Latex L-4000 - 40% aqueous suspension of ionomer (supplier: Asahi Dow Co., Ltd.) | 5 parts |
| 10% aqueous Gosenol GL-05 - polyvinyl alcohol with percentage saponification of 86.5% to 89.0% (supplier: Nippon Synthetic Chemical Industry Co., Ltd.) | 20 parts |
| Water | 13 parts |

The above composition was ground 30 min. for dispersion with glass beads and a polyethylene terephthalate (PET) film 100µ thick having a under layer of gelatin was coated with the resultant suspension to a dry thickness of about 45 mg/dm$^2$ and dried at 50° C. or below to prepare a sample of the present invention.

With an original negative superposed, the sample was exposed across the negative using a xenon flash light RISO TORAPEN UP FX-120 (supplier: Riso Kagaku Kogyo Co., Ltd.) of radiation energy of 0.7 J/cm$^2$.

As a result, a sharp image was reproduced in the surface of sample corresponding to a pattern of surface reflection coefficient, which proved the superior after-exposure image visibility of the sample of present invention. The above sample exposed was then dipped in water and its heat sensitive layer was rubbed with sponge, when unexposed areas were dissolved and removed to give a black sharp positive image.

EXAMPLE 2

The ionomer resin as listed in Table 1 was dispersed to prepare a suspension, with which a polyethylene terephthalate film 100µ thick and coated with a under layer of gelatin was coated to a dry thickness of about 45 mg/dm$^2$. The film was then dried at 50° C. or below to prepare a sample of the present invention.

With an original negative superposed, the sample was exposed across the negative using a xenon flash light RISO TRAPEN UP FX-120 (supplier: Riso Kagaku Kogyo Co., Ltd.). The sample was then dipped in water and its surface was rubbed with sponge for development of an image. The above experiment was repeated by changing the light intensity in six levels: 0.50, 0.70, 0.90, 1.05, 1.25 and 1.50 J/cm$^2$.

The suspension used for formation of a heat sensitive layer by coating was prepared by dispersing the ionomer resin from Table 1, Gosenol GL-05 and carbon black of 30 mµ in mean grain size in a weight ratio of 7:3:5 for 30 min with use of glass beads.

Further, to compare to the above sample of the present invention, comparative samples 1 to 14 were prepared by the same method except that the resin component was changed as indicated in Table 1.

In the table, the minimum radiation energy level at which a visible image could be reproduced by development was indicated in the column "Sensitivity". Namely, a lower value in this column indicates a higher sensitivity. A symbol "—" in the column indicates that no visible image could be developed even at a level of 1.50 J/cm$^2$.

TABLE 1

| Sample | Resin | Sensitivity (J/cm$^2$) |
|---|---|---|
| Invention | Copolene Latex L-2000 -ionomer resin (supplier: Asahi Dow Co., Ltd.) | 0.50 |
| Comp. 1 | EVA #20 - aq. suspension of ethylene/vinyl acetate copolymer (supplier: Denki Kagaku Kogyo Co., Ltd.) | — |
| Comp. 2 | EVA #30 - aq. suspension of ethylene/vinyl acetate copolymer (supplier: Denki Kagaku Kogyo Co., Ltd.) | 1.50 |
| Comp. 3 | Polyemal P-6 - aq. suspension of vinyl acetate copolymer (Asahi Chemical Synthetic Co., Ltd.) | — |
| Comp. 4 | Polyemal P-8 - aq. suspension of vinyl acetate copolymer (Asahi chemical Synthetic Co., Ltd.) | — |
| Comp. 5 | Polyemal PH-81 - suspension of synthetic resin (Asahi chemical Synthetic Co., Ltd.) | 1.50 |
| Comp. 6 | Cevian A 512 - aq. suspension of vinyl acetate copolymer (Daicel Corp.) | 1.05 |
| Comp. 7 | Cevian A 535 - aq. suspension of acrylate ester copolymer (Daicel Corp.) | — |
| Comp. 8 | Cevian A 10057 - aq. suspension of vinyl acetate polymer (Daicel Corp.) | 1.25 |
| Comp. 9 | Saivinol 2040H7 - aq. suspension of synthetic rubber (Saiden Chemical Industry Co., Ltd.) | — |
| Comp. 10 | Primal B-15 - aq. suspension of acrylate ester (Japan Acrylic Chemical Co., Ltd.) | — |
| Comp. 11 | Primal AC-61 - aq. suspension of acrylate ester (Japan Acrylic | 1.05 |

TABLE 1-continued

| Sample | Resin | Sensitivity (J/cm$^2$) |
|---|---|---|
| | Chemical Co., Ltd.) | |
| Comp. 12 | Polysol L-300 - aq. suspension of ethylene/vinyl acetate copolymer resin (Showa Highpolymer Co., Ltd.) | 1.50 |
| Comp. 13 | Polysol L-305 - aq. suspension of ethylene/vinyl acetate copolymer resin (Showa Highpolymer Co., Ltd.) | — |
| Comp. 14 | PR-51464 - aq. suspension of resol form of phenol resin (Sumitomo Durez Co., Ltd.) | 1.25 |

It was concluded from the results given in Table 1 that the sample of the present invention was more sensitive than the comparative samples.

With samples that successfully formed a visible image under exposure to a radiation of energy at or below 1.50 J/cm$^2$, the heat sensitive layer was rubbed witn a piece of sanitary cotton soaked with film cleaner (supplier: Chugai Shashin Yakuhin Co., Ltd.,) when the sample of the present invention remained intact while the comparative samples were found damaged.

EXAMPLE 3

Composition:

| Printex 200 - 45% aq. suspension of carbon black (supplier: Degussa Corp.) | 1 part |
|---|---|
| Copolene Latex L-2000 | 2 parts |
| 10% aq. gelatin solution | 3 parts |
| Water | 4 parts |

The above composition was treated 3 min. by an ultrasonic homogenizer for dispersion. A polyethylene terephthalate (PET) film 100$\mu$ thick with a under layer of gelatin was coated with the resultant suspension to a dry weight of about 45 mg/dm$^2$ using a wire bar and dried at 50° C. or below to prepare another sample of the present invention. This sample was exposed and an image was developed by the same method as in Example 1, when a sharp positive image was reproduced.

EXAMPLE 4

A piece of the sample as prepared in Example 1 was exposed by the same method as in Example 1 and then dipped in water for moistening. It was then impressed strongly on a copy paper and then immediately detached, when the unexposed areas moisted with water were transferred to the copy paper to give a negative print.

EXAMPLE 5

Samples obtained in Example 1 and a laser mask (supplier: Scot Graphics Co., Ltd.—a recording material composed of ethyl cellulose and carbon graphite and having the same construction as disclosed in Japanese Patent Publication No. 35144/1976 was used for laser beam recording through the support) were tested by a Carol's scratch tester to compare the scratch hardness of their recording layer.

The results showed that the samples obtained in Example 1 were almost free from scratches even under a load of 200 g while the laser mask was scratched without any loading. The recording method of the present invention was thus found to be superior in that a recording material with a coating film of high mechanical strength could be used.

EXAMPLE 6

A piece of paper which was coated with polyethylene and surface treated by corona discharges was coated with a suspension of the same composition as in Example 1 to a dry thickness of about 20 mg/dm$^2$ and dried at 50° C. or below to prepare another sample of the present invention.

This sample was then exposed and an image was developed by the same method as in Example 1, when a sharp positive print was reproduced.

EXAMPLE 7

| Carbon black (mean grain size: 30 m$\mu$) | 1 part |
|---|---|
| Copolene Latex L-2000 | 2 parts |
| 10% aq. Gosenol GL-05 | 3 parts |
| Water | 4 parts |

The above composition was processed by the same method as in Example 1 for dispersion, coating and drying to prepare another sample of the present invention.

The sample was then subjected to exposure and development by the same method as in Example 1 but for use of a radiation energy of 0.5 J/cm$^2$, when a sharp positive image was reproduced.

The same sample was scanned with a beam from a 50 mW He-Ne laser Model 125A (supplier: Spectra Physics) for exposure. The sample was developed similarly, when only the scanned areas were left to reproduce a sharp image.

EXAMPLE 8

| Chrome Phthal Blue 4GN - copper phthalocyanine pigment (supplier: Ciba Geigy Co., Ltd.) | 2 parts |
|---|---|
| Copolene Latex L-6000 - 40% aq. suspension of ionomer resin (Asahi Dow Co., Ltd.) | 15 parts |
| 10% aq. Gosenol GL-05 | 10 parts |
| Water | 25 parts |

The above composition was processed by the same method as in Example 1 for dispersion, coating and drying to prepare another sample of the present invention.

The sample was then subjected to exposure and development by the same method as in Example 1 but for use of a radiation energy of 1.5 J/cm$^2$, when a sharp blue positive image was reproduced.

EXAMPLE 9

A piece of the sample prepared in Example 7 was exposed by the same method as in Example 8. It was then impressed on adhesive tape and immediately detached therefrom.

As a result, a negative and positive image were formed on the adhesive tape and sample, respectively.

EXAMPLE 10

The same composition as Example 1 was ground 30 min. for dispersion with glass beads and a polyethylene terephthalate (PET) film 100$\mu$ thick with a under layer of gelatin was coated with the resultant suspension to a dry weight of approx. 45 mg/cm² using a wire bar and dried at 50° C. or below. The coated film was then cut in pieces to provide samples of recording material. Two samples were exposed by different methods as follows. Namely, they were scanned for exposure using a cylinder surface laser beam scanning type exposure system. For the laser beam source, a 50 mW He-Ne laser Model 125A from Spectra Physics was used. The beam from this laser was modulated with use of an acousto-optic modulator (AOM) from Matsushita Electronics Corp. and the zero'th mode beam was focused by a lens of 5 magnifications to expose the recording material, one sample through the support (method of present invention) and the other sample directly from the side on which the recording layer is provided (comparison method). Next, these two samples were dipped in tap water and the recording layer thereon was rubbed with sponge to dissolve and remove unexposed areas.

The results showed that when the recording material was exposed through the support according to the present invention recording was possible at a line speed up to approx. 1 m/sec. while when the material was exposed directly according to the comparison method recording was unsuccessful even at a line speed of approx. 40 cm/sec. It was thus found that the recording method of the present invention could be more than about twice faster saving energy correspondingly.

EXAMPLE 11

Another two samples prepared in Example 10 were exposed using Laser Plate Making System Model 2417 by Log Escan, one through the support and the other directly. The beam source was a YAG laser with a laser power of 7.5 W and beam diameter of 30.5μ.

The results showed that a visible image was reproduced before development regardless of whether exposure was conducted through the support or directly but when the same development process as in Example 10 was applied, a sharp image was reproduced only from the sample that was exposed through the support. It was thus found that the recording method of the present invention was much superior to the method of direct exposure.

EXAMPLE 12

Composition [1] (According to the present invention):

| | |
|---|---|
| Carbon black | 5 parts |
| Copolen L-2000 - 32.1% aqueous suspension of ionomer | 7 parts |
| 10% aq. Gosenol GL-05 | 3 parts |
| Water | 43.2 parts |

Composition [2] (Comparison):

| | |
|---|---|
| Carbon black | 5 parts |
| 36.5% Hytec E-4A (Toho Chemical Co.) | 7 parts |
| 10% aq. Gosenol GL-05 | 3 parts |
| Water | 45.8 parts |

Composition [3] (Comparison):

| | |
|---|---|
| Carbon black | 1 part |
| 25% aq. alubmin | 2 parts |
| Urea | 1 part |
| Water | 16.7 parts |

Each of the above composition was ground 30 min for dispersion with glass beads and a polyethylene terephthalate (PET) film 100μ thick having a subbing gelatin layer was coated with the resultant suspension to a dry thickness of about 45 mg/dm² and dried at 50° C. or below to prepare samples.

With an original negative superposed, the sample was exposed across the negative using an Ar laser.

FIG. 1 shows the relation between the scanning speed and the threshold power of each above samples. 1 is the curve showing this relation of the sample prepared from the above composition [1]. 2 is the curve showing this relation prepared from the above composition [2]. 3 is the curve showing this relation prepared from the above composition [3].

As a result, the sample by composition [1] needs lower threshold power to get image with the high scanning speed in the three samples.

We claim:

1. A heat mode recording material which comprises a support and a heat sensitive layer positioned on said support, said heat sensitive layer comprising;
   (a) an ionomer resin obtained by ionically cross-linking with at least one metal ion, a copolymer comprising an alpha-olefin and an alpha-methylene aliphatic monocarboxylic acid; and
   (b) a hydrophilic binder.

2. A heat mode recording material according to claim 1, wherein said α-olefin is selected from the components represented by the formula RCH=CH wherein R represents hydrogen atom or an alkyl group having 1 to 8 carbon atoms.

3. A heat mode recording material according to claim 1, wherein R is hydrogen atom.

4. A heat mode recording material according to claim 1, wherein said α-methylene aliphatic monocarboxylic acid is one having 3 to 8 carbon atoms.

5. A heat mode recording material according to claim 1, wherein said α-methylene aliphatic monocarboxylic acid is acrylic acid or methacrylic acid.

6. A heat mode recording material according to claim 1, wherein said metal ion is a monovalent, divalent or trivalent metal ion selected from a group consisting of $Na^+$, $K^+$, $Li^+$, $Cs^+$, $Ag^+$ or $Hg^+$; $Be^{++}$, $Mg^{++}$, $Ca^{++}$, $Sr^{++}$, $Ba^{++}$, $Cu^{++}$, $Cd^{++}$, $Hg^{++}$, $Sn^{++}$, $Pb^{++}$, $Fe^{++}$, $Co^{++}$, $Ni^{++}$ or $Zn^{++}$; or $Al^{+++}$, $Sc^{+++}$, $Fe^{+++}$ or $Y^{+++}$.

7. A heat mode recording material according to claim 6, wherein said metal ion is at least one selected from a group consisting of $Na^+$, $Mg^{++}$ and $Zn^{++}$ ions.

8. A heat mode recording material according to claim 7, wherein said α-olefin is ethylene and said α-methylene aliphatic monocarboxylic acid is acrylic acid or methacrylic acid.

9. A heat mode recording material according to claim 1, wherein said heat sensitive layer further comprises a water soluble polymeric compound, said compound being different from said ionomer resin.

10. A heat mode recording material according to claim 9, wherein said water soluble polymeric compound comprises at its main monomer component a vinyl alcohol unit.

11. A heat mode recording material according to claim 10, wherein said polymeric compound comprises 85 to 90 mol % of vinyl alcohol unit.

12. A heat mode recording material according to claim 9, wherein said water soluble polymeric compound and ionomer resin are used in a weight ratio of 3:2 to 1:9.

13. A heat mode recording material according to claim 1 wherein said hydrophilic binder is selected from the group consisting of gelatin, glue, casein, zein, hydroxyethyl cellulose, carboxymethyl cellulose, methyl cellulose, carboxymethyl hydroxyethyl cellulose, hydroxyethyl starch, gum arabic, sucrose octacetate, ammonium alginate, sodium alginate, polyvinyl alcohol, polyvinylpyrrolidone, polyvinyl amine, polyethylene oxide, polystyrylsulfonic acid, and polyacrylic acid.

14. A method for recording image information including the step of exposing a heat mode recording material to high energy density light, said heat mode recording material comprising a support and a heat sensitive layer positioned on said support, said heat sensitive layer comprising;
(a) an ionomer resin obtained by ionically cross-linking with at least one metal ion, a copolymer comprising an alpha-olefin and an alpha-methylene aliphatic monocarboxylic acid; and
(b) a hydrophilic binder.

15. A method according to claim 14, wherein said heat mode material comprises a support which is capable of transmitting said high energy density light and said heat sensitive layer is exposed to said high energy density light through said support.

16. A method according to claim 15, wherein said heat sensitive layer further comprises a substance which is capable of transforming light to heat.

17. A method according to claim 14, wherein said high energy density light is a laser beam.

18. A method according to claim 14, wherein laser beam is one from YAG, Ar or He-Ne laser.

19. A method according to claim 14, wherein said high energy density light has a light intensity of not less than 100 Watt/cm$^2$.

20. The process of claim 14 wherein said hydrophilic binder is selected from the group consisting of gelatin, glue, casein, zein, hydroxyethyl cellulose, carboxymethyl cellulose, methyl cellulose, carboxymethyl hydroxyethyl cellulose, hydroxyethyl starch, gum arabic, sucrose octacetate, ammonium alginate, sodium alginate, polyvinyl alcohol, polyvinylpyrrolidone, polyvinyl amine, polyethylene oxide, polystyrylsulfonic acid, and polyacrylic acid.

* * * * *